United States Patent [19]
Denker

[11] Patent Number: 4,731,747
[45] Date of Patent: Mar. 15, 1988

[54] HIGHLY PARALLEL COMPUTATION NETWORK WITH NORMALIZED SPEED OF RESPONSE

[75] Inventor: John S. Denker, Red Bank, N.J.

[73] Assignee: American Telephone and Telegraph Company, AT&T Bell Laboratories, Murray Hill, N.J.

[21] Appl. No.: 851,239

[22] Filed: Apr. 14, 1986

[51] Int. Cl.[4] ........................ G06G 7/00; G06G 7/02
[52] U.S. Cl. .................................... 364/807; 364/800
[58] Field of Search .............. 364/807, 602, 715, 513, 364/800

[56] References Cited

U.S. PATENT DOCUMENTS

| 4,218,768 | 8/1980 | Hassler | 367/901 X |
| 4,660,166 | 4/1907 | Hopsield | 364/300 X |

OTHER PUBLICATIONS

"Linear Programming on an Electronic Analogue Computer", *Trans. AIEE Part I* (*Comm. & Elect.*), vol. 75, I. B. Pyne, 1956, pp. 139-143.

*Primary Examiner*—Jerry Smith
*Assistant Examiner*—Charles B. Meyer
*Attorney, Agent, or Firm*—Henry T. Brendzel

[57] ABSTRACT

Superior performance is achieved by equalizing the time constants of amplifiers used in highly parallel computational networks. In accordance with one aspect of the invention a feedback arrangement is employed with the resistance between the input of each amplifier i and ground, and the capacitor between the input of each amplifier and ground are instead connected in parallel between the input of each amplifier and its corresponding output. In accordance with another aspect of the invention a balanced impedance arrangement is employed where, for example, a zero current with a non-zero thevenin conductance is achieved by employing equal valued $T_{ij}^+$ and $T_{ij}^-$ conductances.

6 Claims, 3 Drawing Figures

HIGHLY PARALLEL COMPUTATION NETWORK WITH NORMALIZED SPEED OF RESPONSE

BACKGROUND OF THE INVENTION

This relates to apparatus for parallel processing of signals.

Recently, advances in the computational circuits art have brought to the forefront a class of highly parallel computation circuits that solve a large class of complex problems in analog fashion. These circuits comprise a plurality of amplifiers having a sigmoid transfer function and a resistive feedback network that connects the output of each amplifier to the input of the other amplifiers. Each amplifier input also includes a capacitor connected to ground and a conductance connected to ground which may or may not include a capacitor and a conductor in addition to the parasitic capacitance and conductance. Input currents are fed into each amplifier input, and output is obtained from the collection of output voltages of the amplifiers.

A generalized diagram of this circuit is shown in FIG. 1, depicting amplifiers 10, 11, 12, 13 and 14 with positive and negative outputs $V_1$, $V_2$, $V_3$, $V_4$, and $V_N$, respectively. Those outputs are connected to an interconnection block 20 which has output lines 41–45 connected to the input ports of amplifiers 10–14, respectively. Within interconnection block 20, each output voltage $V_i$ is connected to each and every output line of block 20 through a conductance (e.g., resistor). For convenience, the conductance may be identified by the specific output line (i.e., source) that is connected by the conductance to a specific voltage line. For example, $T_{21}^+$ identifies the conductance that connects the non-inverting output $V_2$ to the input of the first amplifier (line 41).

Also connected to each amplifier input port is a parallel arrangement of a resistor and a capacitor (with the second lead of the resistor and capacitor connected to ground), and means for injecting a current into each input port (from some outside source).

Applying Kirchoff's current law to the input port of each amplifier i of FIG. 1 yields the equation:

$$C_i(du_i/dt) = -U_i/R_i + \sum_j (T_{ij}^+ - T_{ij}^-)(V_j - U_i) + I_i \qquad (1)$$

where
$C_i$ is the capacitance between the input of amplifier i and ground,
$1/R_i$ is the equivalent resistance and it equals $$\frac{1}{\rho_i} + \sum_j \frac{1}{R_{ij}},$$

where $\rho_i$ is the resistance between the input of amplifier i and ground,
$U_i$ is the voltage at the input of amplifier i,
$T_{ij}^+$ is the a conductance between the non-inverting output of amplifier j and the input of amplifier i,
$T_{ij}^-$ is the a conductance between the inverting output of amplifier j and the input of amplifier i,
$V_j$ is the positive output voltage of amplifier j, related to $U_j$ by the equation $V_j = g_j(U_j)$, and
$I_i$ is the current driven into the input port of amplifier i by an external source.

When $T_{ij}^+$ and $T_{ij}^-$ are disjoint, $T_{ij}^+ - T_{ij}^-$ may for convenience be expressed as $T_{ij}$, and it is well known that a circuit satisfying Equation (1) with symmetric $T_{ij}$ terms is stable. It is also well known that such a circuit responds to applied stimuli, and reaches a steady state condition after a short transition time. At steady state, $du_i/dt = 0$ and $dV_i/dt = 0$.

With this known stability in mind, the behavior of other functions may be studied which relate to the circuit of FIG. 1 and involve the input signals of the circuit, the output signals of the circuit, and/or the circuit's internal parameters.

Indeed, in a copending application entitled "Optimization Network for the Decomposition of Signals", by J. J. Hopfield, a function was studied that has the form $$E = -\tfrac{1}{2} \sum_i \sum_j T_{ij} V_i V_j + \sum_i (1/R_i) \int_0^{V_i} g_i^{-1}(V) dV - \sum_i I_i V_i. \qquad (2)$$

It is observed in this copending application that the integral of the function $g_i^{-1}(V)$ approaches 0 as the gain of amplifier i approaches infinity. It is also shown in the Hopfield application that the time derivative of the function E is negative, and that it reaches 0 when the time derivative of voltages $V_i$ reaches 0. Since Equation (1) assures the condition of $dV_i/dt$ approaching 0 for all i, the function E of Equation (2) is assured of reaching a stable state. The discovery of this function E led to the use of the FIG. 1 circuit in problem solving applications (such as the classic traveling salesman problem), in associative memory applications, and in decomposition problems (as disclosed in another copending application, by J. J. Hopfield and D. W. Tank, titled "Optimization Network for the Decomposition of Signals").

The FIG. 1 circuit can solve problems which can be structured so that the function to be minimized has at most second order terms in some parameters of the problem to permit correspondence to Equation (2). Other problems, however, may require the minimization of equations that contain terms of order higher than two. Those problems are solvable through the use of inter-neuron amplifiers, as described in another application by J. S. Denker filed on even date herewith entitled "A Highly Parallel Computation Network With Means for Reducing the Algebraic Degree of the Objective Function".

In each one of above, the $T_{ij}^+$ and the $T_{ij}^-$ are conductances that assume different values, which are a function of the problem to be solved. The different values, however, cause the circuit to behave differently in response to different stimuli because of the different time constants associated with each amplifier.

SUMMARY OF THE INVENTION

Superior performance is achieved by equalizing the time constants of amplifiers used in highly parallel computational networks. One technique employs a feedback arrangement where the resistance between the input of each amplifier i and ground, and the capacitor between the input of each amplifier and ground are instead connected in parallel between the input of each amplifier and its corresponding output. A second technique employs a balanced impedance arrangement where, for example, a zero current with a non-zero thevenin conductance is achieved by employing equal valued $T_{ij}^+$ and $T_{ij}^-$ conductances.

DETAILED DESCRIPTION

Figure 1:
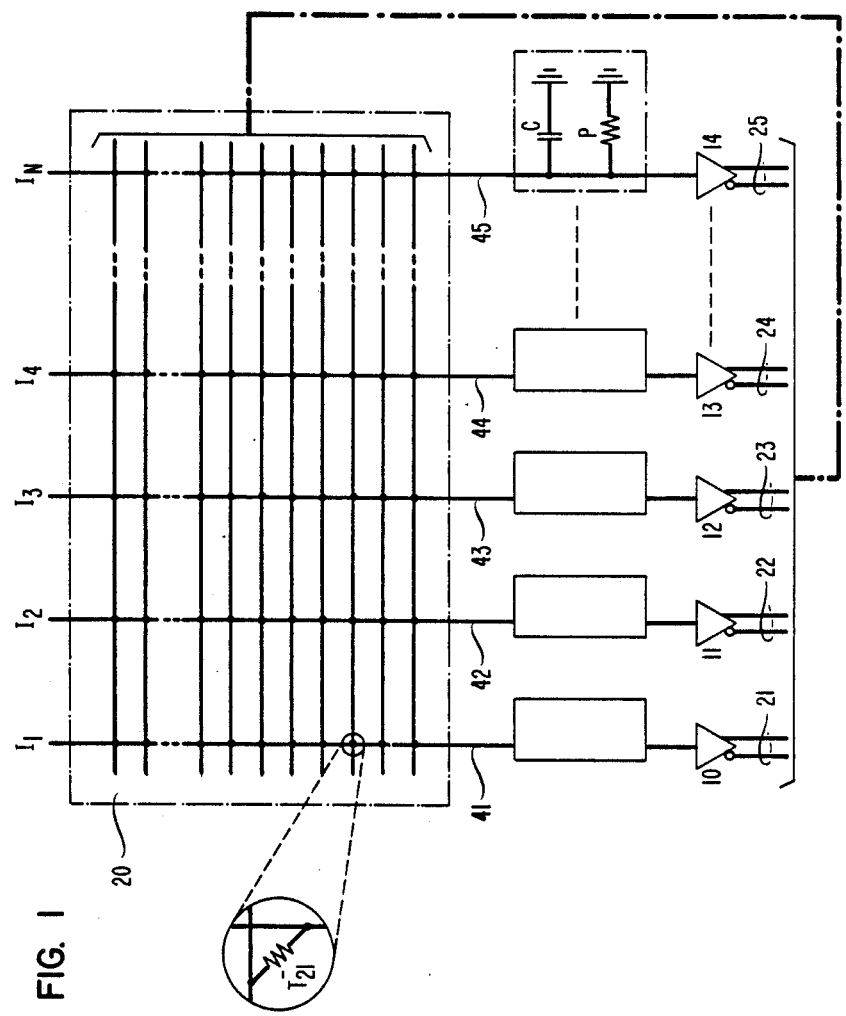
FIG. 1 describes the prior art highly interconnected analog network.

The FIG. 1 circuit includes a capacitor and a resistor between each amplifier input and ground. The capacitor is the element that controls the time constant, or speed, of the circuit and in ordinary circuits it would behoove the designer to make the capacitor as small as practicable. The circuit of FIG. 1, however, permits feedback to be established through what effectively is a series connection of a number of amplifiers. Without any capacitance in the circuit, instability would almost certainly occur. Even with capacitance in the circuit an instability condition could result except that, with the particular selection of the $T_{ij}$ conductances in accordance with Hopfield's requirements, stability is maintained.

There is an additional aspect to the presence of the capacitors. When the feedback paths to a particular capacitor of FIG. 1 are combined to appear as a single equivalent voltage and an equivalent resistance, $R_e$, it becomes readily apparent that a pole exist in the frequency domain. That pole derives from the voltage division action of the capacitor and its parallel resistor, yielding a gain equation for each amplifier that is related to $1/(1+sCR_e)$. From this it is apparent that the pole position is a function of the feedback resistors and, therefore, we can expect different pole positions associated with different amplifiers in the FIG. 1 circuit. In turn, we should expect different speeds of response from the different amplifiers. What this means is that the circuit of FIG. 1 minimizes the energy function of Equation (2), but the manner in which it reaches this minimum is less than optimum since the slowest amplifier dictates the response time of the entire circuit.

Figure 2:
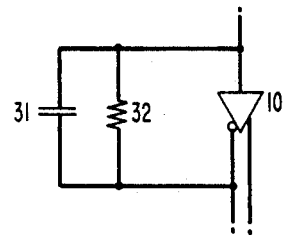
FIG. 2 describes a network constructed in accordance with the virtual ground approach of our invention.

In accordance with one aspect of my invention, the problem of different pole positions is obviated with the circuit of FIG. 2 where each capacitor (and its parallel resistor) is connected between its associated amplifier output and its negative input. The result is a virtual ground operation with an associated gain equation of $R/R_e(1+sCR)$, where R is the resistor connected in parallel with the capacitor. That yields a fixed pole that is related solely to the capacitor and its parallel resistor. Correspondingly, the result is equal speeds of response to all of the amplifiers, and the fastest settling time of the circuit for a given capacitance value.

Figure 3:
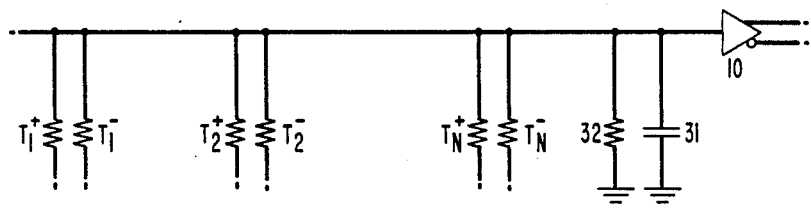
FIG. 3 describes a network constructed in accordance with the balanced conductance approach of our invention.

In accordance with another aspect of my invention, the problem of different pole positions is obviated with the circuit of FIG. 3. Therein, amplifier 10 is shown with input capacitor 11 and an input resistor 12 connected between the input of amplifier 10 and ground. Also connected to the input of amplifier 10 are conductance pairs $(T_1^+,T_1^-)$, $(T_2^+,T_2^-)$, and $(T_n^+,T_n^-)$. Each pair $(T_i^+,T_i^-)$ derives its input from the output of amplifier i, and the output impedance of the amplifiers is assumed to be negligible.

The prior art computations of the $T_{ij}$ values yield either positive or negative $T_{ij}$ terms of different magnitudes. Since the amplifier input nodes are essentially at zero voltage potential, a negative $T_{ij}$ simply means that current flows out of the amplifier's input node. A positive $T_{ij}$ means that current flows into the amplifier's input node. In the prior art, when a computed $T_{ij}$ is negative, the neural network of FIG. 1 incorporates a $T_{ij}^-$ element into the matrix. Correspondingly, when a computed $T_{ij}$ is positive, the neural network of FIG. 1 incorporates a $T_{ij}^+$ element into the matrix. From this it can be seen that $T_{ij}^+$ and $T_{ij}^-$ are disjoint; that is, either one or the other but not both appear at any one time.

In accordance with my invention, regardless of the required sign and magnitude of the computed $T_{ij}$, both the $T_{ij}^+$ and the $T_{ij}^-$ conductances are included in the matrix, as shown in FIG. 3. The effective conductance presented to amplifier 10 by the conductance pair $T_i^+$ and $T_i^-$ is $(T_i^+ + T_i^-)$ and that sum, in accordance with the principles of my invention, is arranged to be constant. Since that effective conductance is constant, e.g., K, the effective overall conductance presented at the input node of each amplifier is also constant, and that results in equal speeds of response for the amplifier. On the other hand, the current that is actually flowing into each amplifier's input node must be different, as specified by the computed $T_{ij}$, and that current is equal to $(T_{ij}^+ - T_{ij}^-)$. That value, e.g., $+A$, can be obtained while maintaining the requirement that $(T_i^+ + T_i^-) = K$ by selecting the magnitude of $T_i^+$ to be equal $\frac{1}{2}(K+A)$ by the magnitude of $T_i^-$ to be equal $\frac{1}{2}(K-A)$.

To those skilled in the art to which this invention relates, many changes in embodiments and applications of the invention will suggest themselves without departing from the spirit and scope of the invention. For example, in situations where there are a large number of required zero currents flowing into the amplifier nodes, and it is more convenient to create conductances of magnitude K (rather than some value between K and 0), it may be useful to create $T_i^+ = T_j^- = K$ conductances at half of the amplifiers, and zero conductances at the other half of the amplifiers. In light of the above, the disclosures and the description herein are to be taken as purely illustrative, and not limiting in any sense.

What is claimed is:

1. A network comprising:
    a plurality of amplifiers $A_i$ each having an input node at which there is developed an input voltage $U_i$, and each developing a non-inverting output $V_i$ and an inverting output $-V_i$, with both of said outputs being related to said input by a sigmoid function $g_i$;
    means for applying input current $I_i$ to said input of each of said amplifiers $A_i$;
    a conductance network for connecting said positive and negative outputs to said inputs, said conductance network comprising conductance values selected for the nature of the decisional operation for which it is intended to minimize the energy function $$E = -\tfrac{1}{2} \sum_i \sum_j T_{ij} V_i V_j + \sum_i (1/R_i) \int_0^{V_i} g_i^{-1}(V) dV - \sum_i I_i V_i$$

where $V_i$ and $V_j$ are output voltages of said amplifiers $A_i$ and $A_j$, respectively, $T_{ij}$ is a conductance that relates the amplified input voltage of amplifier $A_i$, $g(U_i)$ to the input node of amplifier $A_j$, $R_i$ is the equivalent resistance at said input of said amplifier $A_i$ and $g_i^{-1}$ is the inverse of $g_i$; and means for equalizing the speed of response of said amplifiers.

2. The network of claim 1 wherein said means for equalizing comprises a subnetwork associated with each of said amplifiers and connected between the input and the negative output of each of said amplifiers.

3. The network of claim 2 wherein said subnetwork comprises a parallel interconnection of a resistor and a capacitor.

4. The network of claim 1 wherein said means for equalizing includes the use of a conductance $T_{ij}^-$ with each conductance $T_{ij}^+$ such that $(T_{ij}^+ + T_{ij}^-)$ is a constant and $(T_{ij}^+ - T_{ij}^-)$ is equal to said conductance $T_{ij}$, where $T_{ij}^+$ is a conductance connected between output $V_i$ of amplifier $A_i$ and the input node of amplifier $A_j$ and $T_{ij}^-$ is a conductance connected between output $-V_i$ of amplifier $A_i$ and the input node of amplifier $A_j$.

5. The network of claim 1 wherein said means for equalizing includes the use of conductance pairs $T_{ij}^+$ and $T_{ij}^-$ in said conductance network where the sum of said $T_{ij}^+$ and $T_{ij}^-$ values is essentially of a preselected value.

6. The network of claim 5 wherein said $T_{ij}^+$ and said $T_{ij}^-$ are not disjoint.

* * * * *